US006532173B2

United States Patent
Iioka et al.

(10) Patent No.: US 6,532,173 B2
(45) Date of Patent: Mar. 11, 2003

(54) NONVOLATILE SEMICONDUCTOR MEMORY DEVICE WITH MECHANISM TO PREVENT LEAK CURRENT

(75) Inventors: Osamu Iioka, Kawasaki (JP); Naoto Emi, Kawasaki (JP); Atsushi Shoji, Kawasaki (JP); Hiroshi Mawatari, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/101,846

(22) Filed: Mar. 21, 2002

(65) Prior Publication Data

US 2003/0012051 A1 Jan. 16, 2003

(30) Foreign Application Priority Data

Jul. 10, 2001 (JP) ........................................ 2001-209639

(51) Int. Cl.[7] ................................................ G11C 16/04
(52) U.S. Cl. .............................. 365/185.16; 365/185.13
(58) Field of Search ....................... 365/185.13, 185.16, 365/185.18, 185.33

(56) References Cited

U.S. PATENT DOCUMENTS

| 5,790,450 | A | | 8/1998 | Nishizaka et al. .......... 365/104 |
| 6,088,265 | A | * | 7/2000 | Ohta ..................... 365/185.16 |
| 6,272,043 | B1 | * | 8/2001 | Hollmer ................. 365/185.16 |
| 6,278,649 | B1 | * | 8/2001 | Lee et al. ............... 365/230.03 |

FOREIGN PATENT DOCUMENTS

JP 6-68683 3/1994

* cited by examiner

Primary Examiner—Son Mai
(74) Attorney, Agent, or Firm—Arent Fox Kintner Plotkin & Kahn, PLLC

(57) ABSTRACT

A nonvolatile semiconductor memory device includes a virtual-ground memory array which includes a plurality of nonvolatile memory cells and sub-bit lines connected to the nonvolatile memory cells, first and second selection lines, first and second selection transistors which become conductive in response to activation of the first selection line, a third selection transistor which become conductive in response to activation of the second selection line, a first main bit line which is coupled to and supplies a drain potential to a sub-bit line situated on a drain side of a selected memory cell through the first selection transistor, a second main bit line which is coupled to and supplies a source potential to a sub-bit line situated on a source side of the selected memory cell through one of the second selection transistor and the third selection transistor, and a third main bit line which is coupled to a sub-bit line adjacent to the sub-bit line situated on the drain side of the selected memory cell through another one of the second selection transistor and the third selection transistor, and is coupled to a potential substantially the same as the drain potential.

10 Claims, 6 Drawing Sheets

NONVOLATILE SEMICONDUCTOR MEMORY DEVICE WITH MECHANISM TO PREVENT LEAK CURRENT

BACKGROUND OF THE INVENTION

1. Field of the Invention

The present invention generally relates to semiconductor memory devices, and particularly relates to a nonvolatile semiconductor memory device having a virtual-ground memory array.

2. Description of the Related Art

In the virtual-ground memory array of flash memories, bit lines are formed as diffusion layers, and a source and a drain will switch positions depending on how the diffusion layers of two bit lines are coupled to the ground potential and the power supply potential.

FIG. 1 is a circuit diagram showing a portion of a virtual-ground memory array.

The virtual-ground memory array of FIG. 1 includes memory cells 10-1 through 10-7, selection transistors 11-1 through 11-8, sub-bit lines BL1 through BL8, and selection lines SL0 through SL3. When the memory cell 10-2 is to be selected, a word line WL is activated to select all the memory cells connected to the word line WL, and the selection lines SL1 and SL3 are activated to make the selection transistors 11-2 and 11-3 conductive. With this setting, one of the sub-bit lines BL2 and BL3 is coupled to HIGH to serve as a drain, and the other one is coupled to LOW to serve as a source, thereby reading data from the memory cell 10-2.

When data of a selected memory cell is to be retrieved as described above, a leak current runs from the sub-bit line BL3 to an unselected memory cell 10-3 if the sub-bit line BL3 is the one that is set at the HIGH potential. This undesirably prevents the potential of the selected memory cell from rising to a sufficient level in a short time, resulting in a decrease of a sense margin, which further results in a degradation of data retrieval efficiency.

Accordingly, there is a need for a semiconductor memory device which is provided with a mechanism to prevent a leak current in a virtual-ground memory array.

SUMMARY OF THE INVENTION

It is a general object of the present invention to provide a semiconductor memory device that substantially obviates one or more of the problems caused by the limitations and disadvantages of the related art.

Features and advantages of the present invention will be set forth in the description which follows, and in part will become apparent from the description and the accompanying drawings, or may be learned by practice of the invention according to the teachings provided in the description. Objects as well as other features and advantages of the present invention will be realized and attained by a semiconductor memory device particularly pointed out in the specification in such full, clear, concise, and exact terms as to enable a person having ordinary skill in the art to practice the invention.

To achieve these and other advantages and in accordance with the purpose of the invention, as embodied and broadly described herein, a nonvolatile semiconductor memory device according to the present invention includes a virtual-ground memory array which includes a plurality of nonvolatile memory cells and sub-bit lines connected to the nonvolatile memory cells, first and second selection lines, first and second selection transistors which become conductive in response to activation of the first selection line, a third selection transistor which become conductive in response to activation of the second selection line, a first main bit line which is coupled to and supplies a drain potential to a sub-bit line situated on a drain side of a selected memory cell through the first selection transistor, a second main bit line which is coupled to and supplies a source potential to a sub-bit line situated on a source side of the selected memory cell through one of the second selection transistor and the third selection transistor, and a third main bit line which is coupled to a sub-bit line adjacent to the sub-bit line situated on the drain side of the selected memory cell through another one of the second selection transistor and the third selection transistor, and is coupled to a potential substantially the same as the drain potential.

In the nonvolatile semiconductor memory device as described above, when data of a selected memory cell is to be read, the first main bit line supplies the drain potential through the first selection transistor, and the second main bit line supplies the source potential through one of the second selection transistor and the third selection transistor, with the third main bit line supplying the potential substantially the same as the drain potential to a sub-bit line adjacent to the sub-bit line serving as the drain through the other one of the second selection transistor and the third selection transistor. As a result, the sub-bit line of an unselected memory cell is set to the same potential as the sub-bit line serving as the drain, thereby preventing a leak current from leaking from the sub-bit line of the drain to the sub-bit line of the unselected memory cell.

In the configuration described above, the potentials of the first through third main bit lines can be supplied by activating only two selection lines, so that the invention is implemented without increasing the numbers of selection lines and selection transistors compared with the related-art configuration.

Other objects and further features of the present invention will be apparent from the following detailed description when read in conjunction with the accompanying drawings.

DESCRIPTION OF THE PREFERRED EMBODIMENTS

In the following, embodiments of the present invention will be described with reference to the accompanying drawings.

Figure 2:
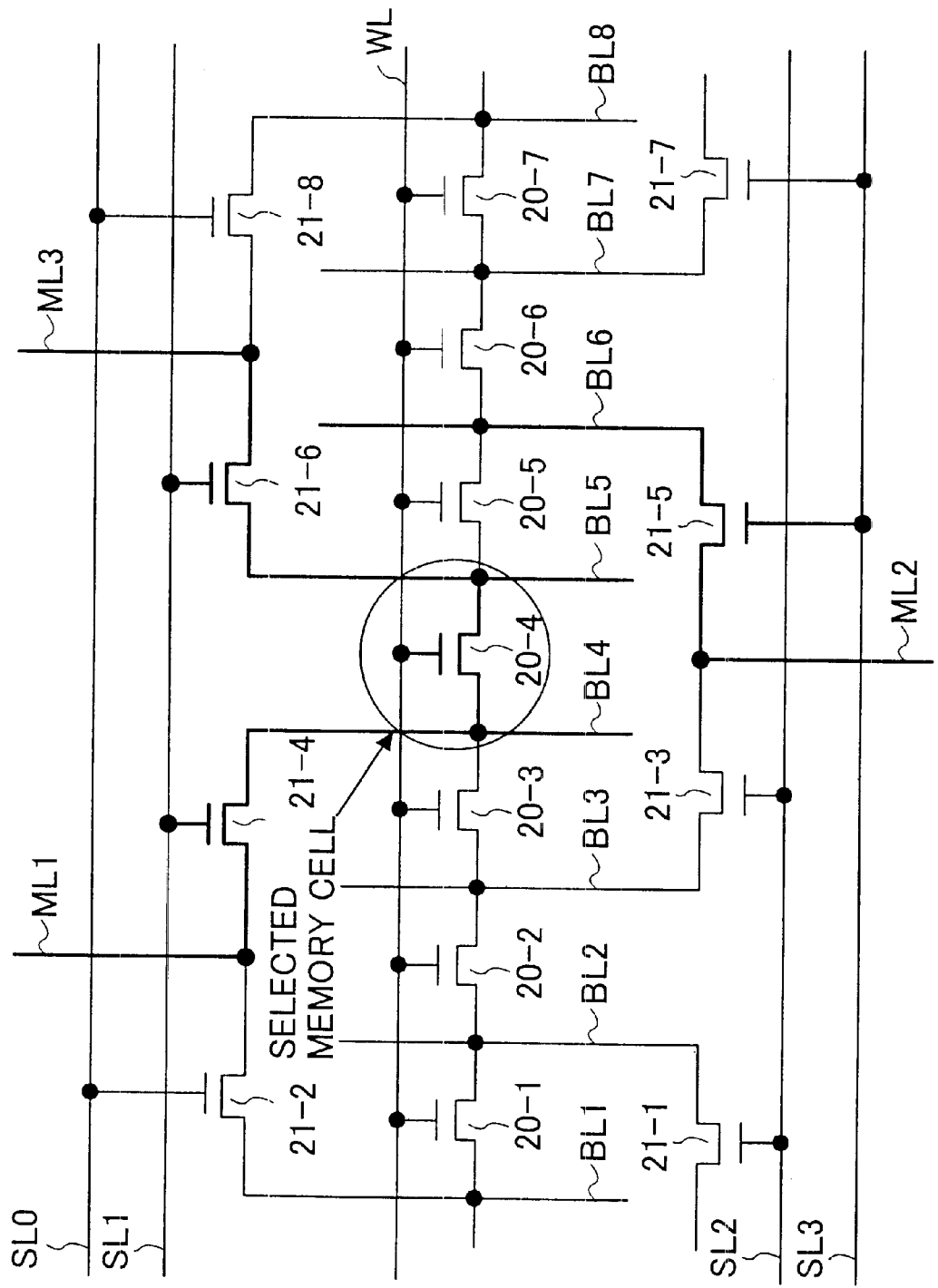
FIG. 2 is a circuit diagram showing a configuration of a virtual-ground memory array according to the present invention.

FIG. 2 is a circuit diagram showing a configuration of a virtual-ground memory array according to the present invention.

The virtual-ground memory array of FIG. 2 includes memory cells 20-1 through 20-7, selection transistors 21-1 through 21-8, sub-bit lines BL1 through BL8, main bit lines ML1 through ML3, and selection lines SL0 through SL3. When the memory cell 20-4 is to be selected, a word line WL is activated to select all the memory cells connected to the word line WL, and the selection line SL1 is activated to make the selection transistors 21-4 and 21-6 conductive. With this setting, one of the sub-bit lines BL4 and BL5 is coupled to HIGH to serve as a drain, and the other one is coupled to LOW to serve as a source, thereby reading data from the memory cell 20-4.

If the sub-bit line BL5 is set to HIGH in this case, for example, the sub-bit line BL6 is set to HIGH so as to prevent a leak current from flowing from the sub-bit line BL5 to the memory cell 20-5. To this end, the selection line SL3 is activated to turn on the selection transistor 21-5 when the memory cell 20-4 is to be selected in the virtual-ground memory array of FIG. 2. As a result, the sub-bit line BL6 is coupled to the main bit line ML2 via the selection transistor 21-5 and set to HIGH. With this provision, the sub-bit line BL5 and the sub-bit line BL6 are set to the same potential, so that no leak current flows from the sub-bit line BL5 to the memory cell 20-5.

Figure 1:
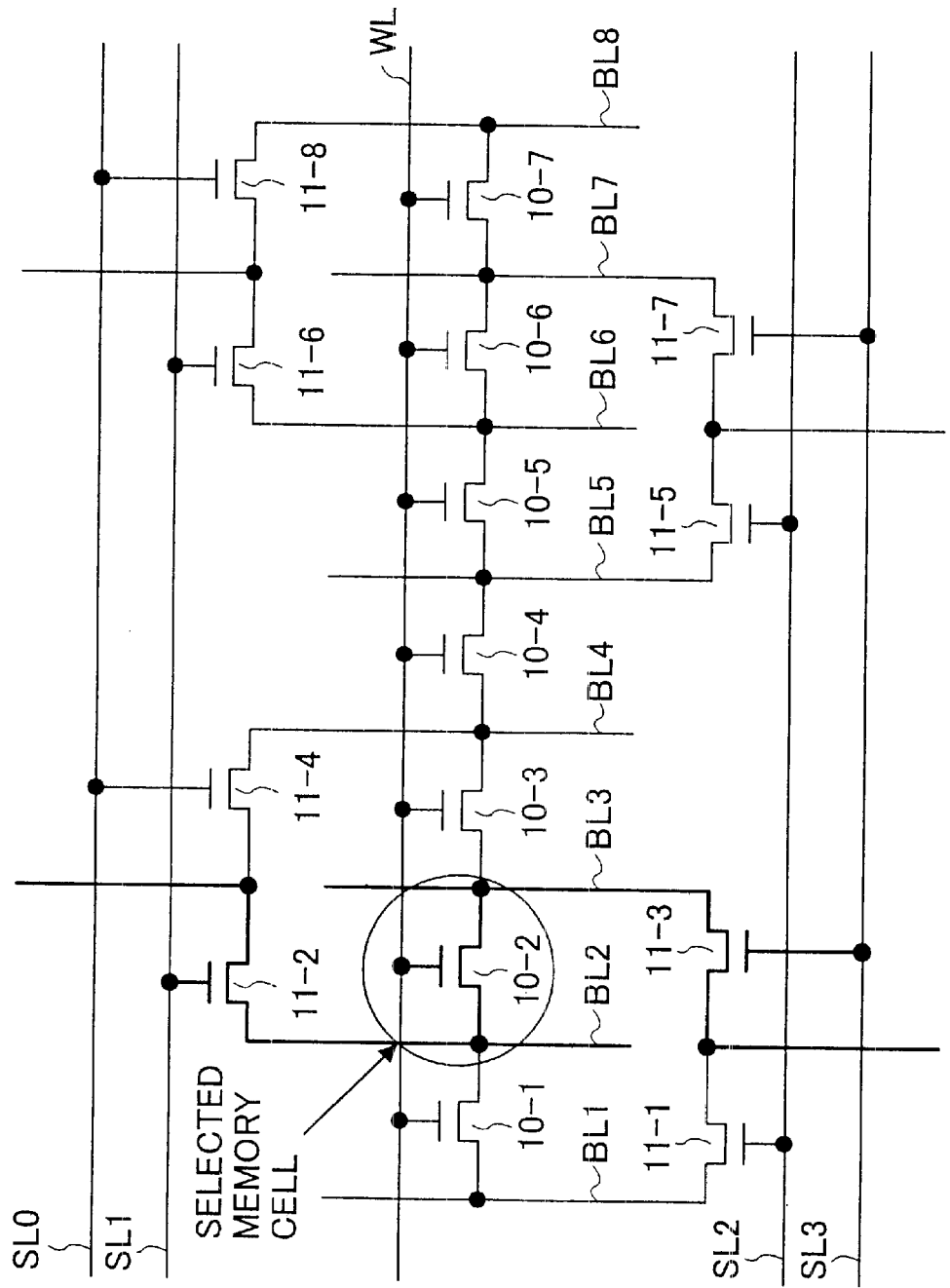
FIG. 1 is a circuit diagram showing a portion of a related-art virtual-ground memory array.

In the related-art configuration of FIG. 1, data of the memory cell 10-2 may be retrieved by setting the sub-bit lines BL2 and BL3 to LOW and HIGH, respectively. In this case, the sub-bit line BL4 is connected to the same main bit line as is the sub-bit line BL2, so that it is not possible to provide a HIGH potential to the sub-bit line BL4. In the present invention, on the other hand, the memory cells, the sub-bit lines, the selection transistors, and the main bit lines are arranged as shown in FIG. 2, so that a sub-bit line is set to the HIGH potential at a position next to the sub-bit line that is set to the HIGH potential on the drain side of the selected memory cell. This prevents a leak current.

Figure 3:
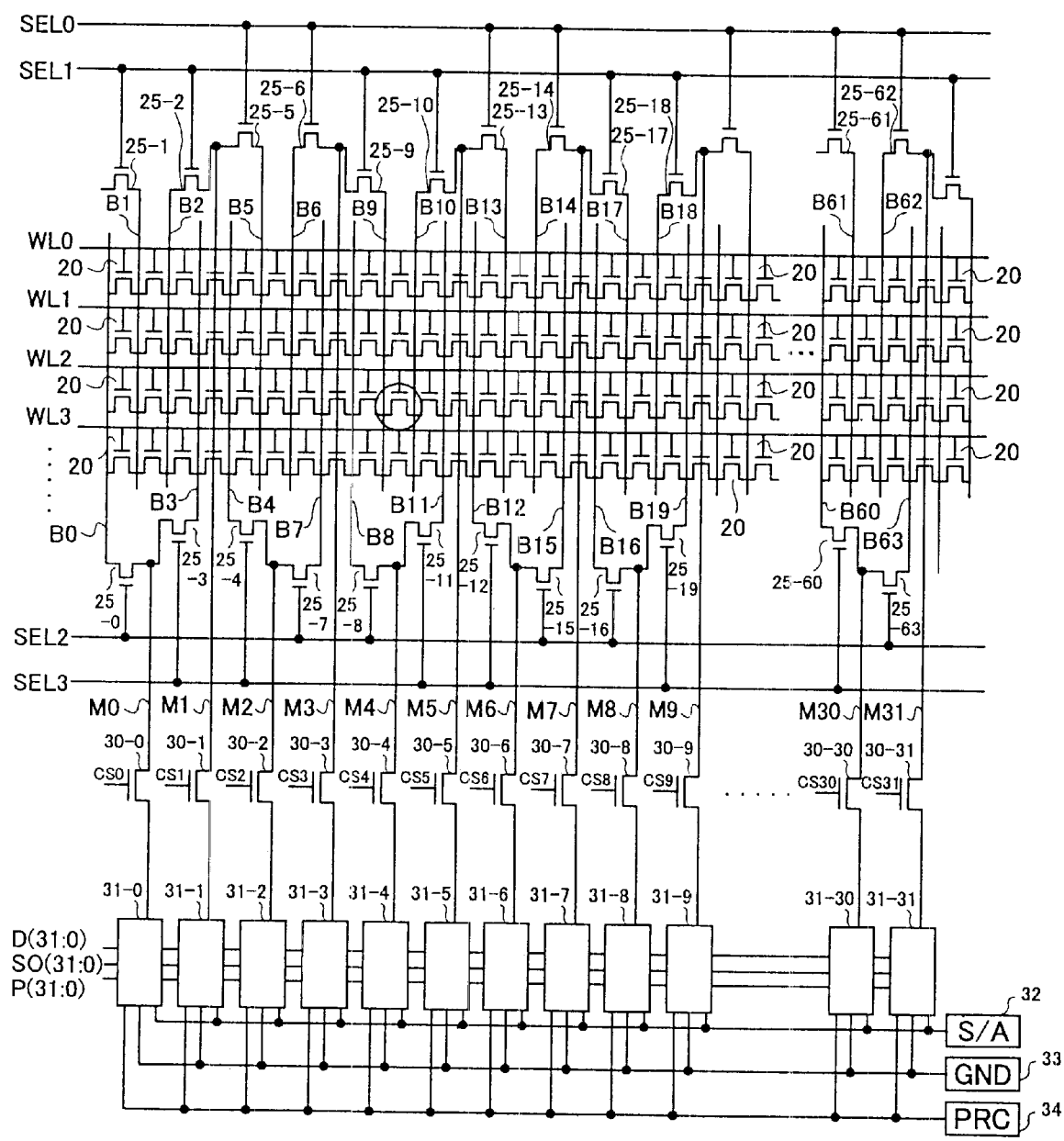
FIG. 3 is a circuit diagram of the virtual-ground memory array and surrounding circuitry according to the present invention.

FIG. 3 is a circuit diagram of the virtual-ground memory array and surrounding circuitry according to the present invention.

The circuit of FIG. 3 includes word lines WL0 through WL3, a plurality of memory cells 20 arranged in rows and columns, sub-bit lines B0 through B63 connected to the memory cells, selection transistors 25-0 through 25-63, selection lines SEL0 through SEL3, main bit lines M0 through M31 connected to the sub-bit lines through the selection transistors, column selection transistors 30-0 through 30-31, potential selection units 31-0 through 31-31, a sense amplifier (S/A) 32, a ground-potential generation circuit (GND) 33, and a precharge circuit (PRC) 34.

In the following, a description will be given with regard to an operation that is performed when a memory cell 20 illustrated as encircled is read.

The word line WL2 is selectively activated first, thereby selecting all the memory cells connected to the word line WL2. A column selection signal CS5 is set to HIGH to make the column selection transistor 30-5 conductive, and the selection line SEL1 is activated to make the selection transistor 25-10 conductive. As a result, the sub-bit line B10 is coupled to the potential selection unit 31-5 via the selection transistor 25-10, the main bit line M5, and the column selection transistor 30-5.

By the same token, the column selection signal CS3 is set to HIGH to turn on the column selection transistor 30-3. Since the selection line SEL1 is already in an activated state, the selection transistor 25-9 is in a conductive state. As a result, the sub-bit line B9 is coupled to the potential selection unit 31-3 via the selection transistor 25-9, the main bit line M3, and the column selection transistor 30-3.

Each of the potential selection unit 31-0 through 31-31 couples one of the sense amplifier (S/A) 32, the ground-potential generation circuit (GND) 33, and the precharge circuit (PRC) 34 to a main word line in response to a change to HIGH of a drain selection signal D, a source selection signal SO, and a precharge selection signal P. Each of the drain selection signal D, the source selection signal SO, and the precharge selection signal P is a 32-bit signal (31:0), and is capable of setting each of the potential selection unit 31-0 through 31-31 to different selected conditions.

In this example, the drain selection signal D of the potential selection unit 31-5 is set to HIGH so as to couple the sense amplifier 32 to the main bit line M5. As a result, the sub-bit line B10 is coupled to the sense amplifier 32 via the selection transistor 25-10, the main bit line M5, the column selection transistor 30-5, and the potential selection unit 31-5. Further, the source selection signal SO of the potential selection unit 31-3 is set to HIGH so as to couple the ground-potential generation circuit 33 to the main bit line M3. As a result, the sub-bit line B9 is coupled to the ground-potential generation circuit 33 via the selection transistor 25-9, the main bit line M3, the column selection transistor 30-3, and the potential selection unit 31-3.

Accordingly, data of the encircled memory cell 20 is retrieved by using the sub-bit lines B10 and B9 as a drain and a source, respectively. In order to prevent a leak current from running from the sub-bit line B10 to the sub-bit line B11, the sub-bit line B11 is set to a HIGH potential as follows.

The column selection line CS4 is set to HIGH to turn on the column selection transistor 30-4, and the selection line SEL3 is activated to make the selection transistor 25-11 conductive. As a result, the sub-bit line B11 is coupled to the potential selection unit 31-4 via the selection transistor 25-11, the main bit line M4, and the column selection transistor 30-4. The precharge selection signal P supplied to the potential selection unit 31-4 is set to HIGH, so that the main word line M4 is coupled to the precharge circuit 34. As a result, the sub-bit line B11 is coupled to the precharge circuit 34 via the selection transistor 25-11, the main bit line M4, the column selection transistor 30-4, and the potential selection unit 31-4. The precharge circuit 34 generates a potential substantially the same as the drain potential, and supplies the generated potential to the sub-bit line B11.

Accordingly, the sub-bit lines B10 and B11 are set to the same potential, thereby preventing a leak current from leaking from the sub-bit line B10 to the sub-bit line B11 through an intervening memory cell.

If data of the encircled memory cell 20 is retrieved by using the sub-bit lines B10 and B9 as a source and a drain, respectively, a leak current should be prevented from flowing from the sub-bit line B9 to the sub-bit line B8. To this end, the sub-bit line B8 is coupled to the precharge circuit 34 in the same manner as describe above, so that the sub-bit line B8 is set to HIGH.

Figure 4:
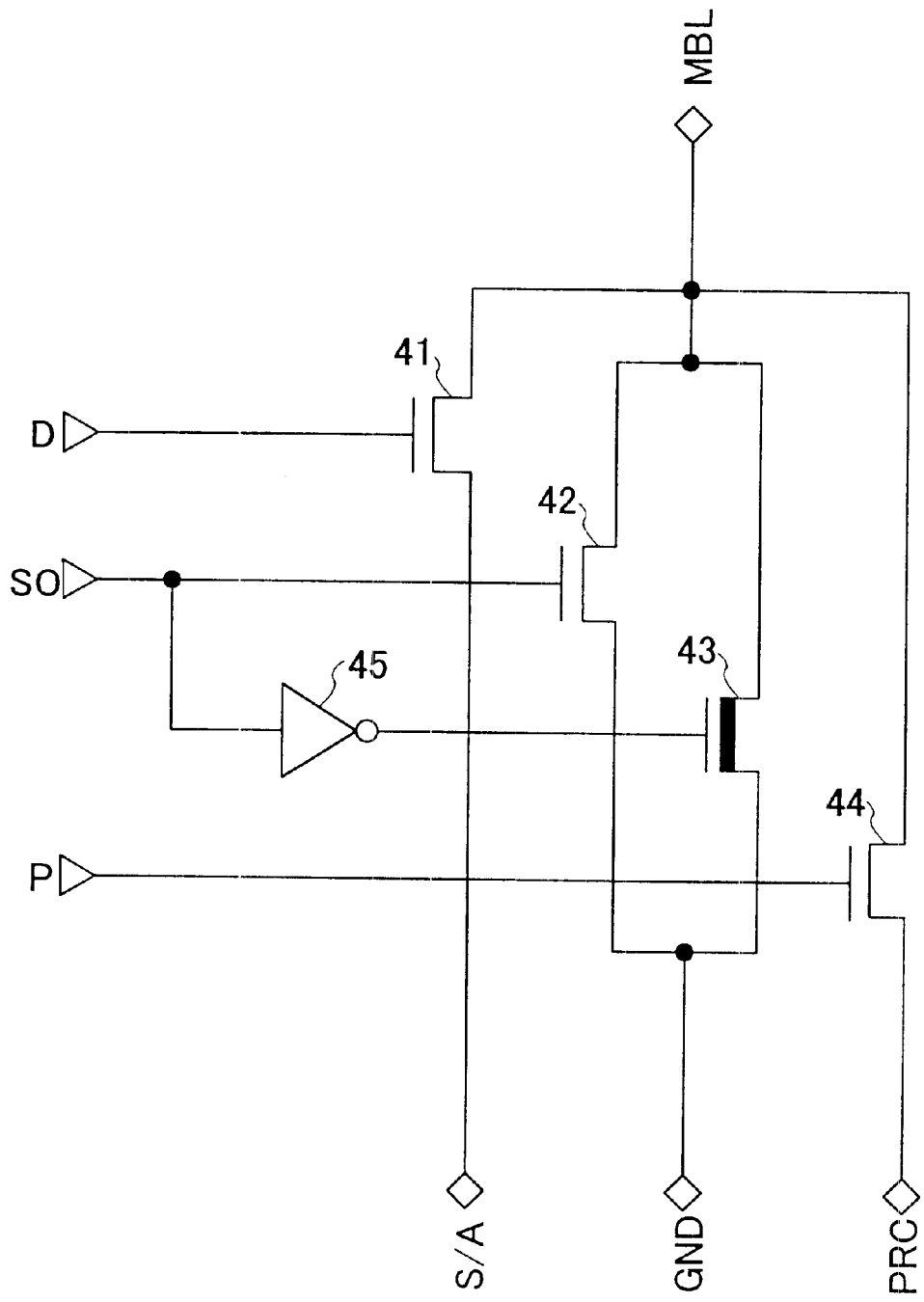
FIG. 4 is a circuit diagram showing a circuit configuration of a potential selection unit.

FIG. 4 is a circuit diagram showing a circuit configuration of the potential selection unit. The potential selection units 31-0 through 31-31 have the same configuration that is shown in FIG. 4.

The potential selection unit of FIG. 4 includes NMOS transistors 41 and 42, a PMOS transistor 43, an NMOS transistor 44, and an inverter 45. When the drain selection signal D is set to HIGH, the NMOS transistor 41 becomes conductive, thereby coupling the sense amplifier (S/N) 32 to a main bit line MBL. When the source selection signal SO is set to HIGH, the NMOS transistor 42 and the PMOS transistor 43 become conductive, so that the ground-potential generation circuit (GND) 33 is coupled to the main bit line MBL. Activation of the precharge selection signal P to HIGH makes the NMOS transistor 44 conductive, thereby coupling the precharge circuit (PRC) 34 to the main bit line MBL. Here, the PMOS transistor 43 is provided in order to secure a conductive path when a negative potential is applied to GND at the time of an erase operation since the NMOS transistor 42 does not turn on by its nature in such a situation. The provision of the PMOS transistor 43 is not an essential part of the present invention.

Figure 5:
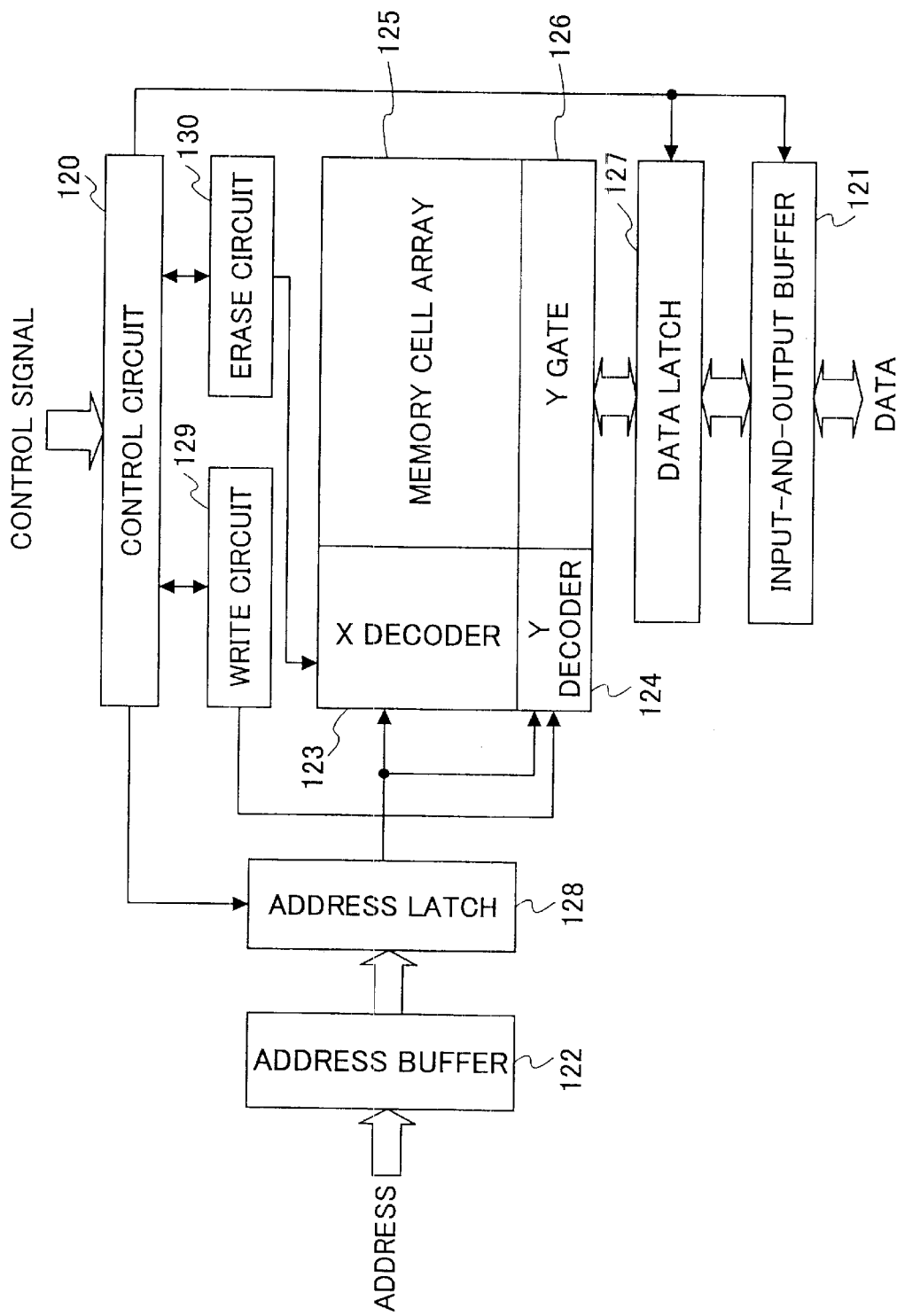
FIG. 5 is a block diagram showing a configuration of a flash memory to which the present invention is applied.

FIG. 5 is a block diagram showing a configuration of a flash memory to which the present invention is applied.

The flash memory of FIG. 5 includes a control circuit 120, an input-and-output buffer 121, an address buffer 122, an X decoder 123, a Y decoder 124, a memory cell array 125, a Y gate 126, a data latch 127, an address latch 128, a write circuit 129, and an erase circuit 130.

The control circuit 120 operates as a state machine based on control signals received from an exterior of the device, and controls the operation of various parts of the flash memory.

The address buffer 122 receives address signals supplied from the exterior of the device, and provides the address signals to the address latch 128. The address latch 128 latches the supplied address signals, and supplies the latched address signals to the X decoder 123 and the Y decoder 124. The X decoder 123 decodes the address supplied from the address latch 128, and activates a word line of the memory cell array 125 according to the decode results. The Y decoder 124 decodes the address supplied from the address latch 128, and drives the Y gate 126 based on the decode results. The Y gate 126 selectively couples the bit lines of the memory cell array 125 to the data latch 127. This establishes a data read/write path with respect to the memory cell array 125.

The memory cell array 125 includes an array of memory cells, word lines, sub-bit lines, main bit lines, and selection transistors, etc., like the configuration of FIG. 3, and stores information in each memory cell. At the time of a data read operation, data from the memory cells specified by an activated word line and sub-bit lines is supplied to the data latch 127 through the Y gate 126. At the time of a program or erase operation, the write circuit 129 or the erase circuit 130 generates a predetermined write potential or a predetermined erase potential under the control of the control circuit 120, and sets the word lines and sub-bit lines of the memory cell array 125 to potentials suitable for respective operations. In this manner, operations of injecting electric charge into or removing electric charge from memory cells are carried out.

The data latch 127 compares the level of data supplied from the memory cell array 125 through the Y gate 126 with a read reference level, thereby checking whether the supplied data is 0 or 1. The check result is supplied to the exterior of the device from the input-and-output buffer 121 as read-out data. Verify operations associated with a program operation and an erase operation are performed by comparing the level of data supplied from the memory cell array 125 through the Y gate 126 with respective reference levels.

The Y gate 126 corresponds to the column selection transistors 30-0 through 30-31 of FIG. 3, and the data latch 127 corresponds to the sense amplifier 32 and the surrounding circuitry including the potential selection units 31-0 through 31-31, the ground-potential generation circuit 33, the precharge circuit 34, etc.

In the following, a MNOS (metal nitride oxide semiconductor) configuration employing a nitride layer as a charge capture layer will be described.

The present invention can be applied to an MNOS which uses a nitride layer as a charge capture layer.

An MNOS employing a virtual-ground memory array is a nonvolatile semiconductor memory device that uses a nitride layer as a charge capture layer so as to make it possible to store 2-bit information in a single memory cell transistor. In such a nonvolatile semiconductor memory device, two ends of a single nitride layer situated between adjacent bit lines are used as two separate memory cells, and stores therein 2 bits of data that are represented by whether hot electrons are injected therein. Such 2-bit data storage is made possible by the characteristics of the nitride layer that do not allow electric charge to move in the nitride layer serving as a charge capture layer.

Figure 6:
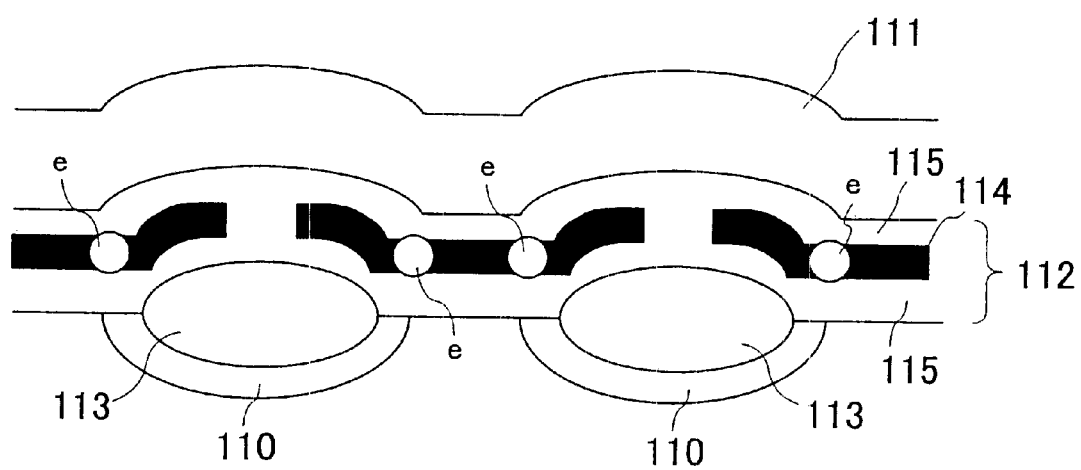
FIG. 6 is a partial sectional view of an MNOS cell array.

FIG. 6 is a partial sectional view of an MNOS cell array.

The configuration of FIG. 6 includes buried diffusion layers 110, word lines 111, a charge capture layer 112, and bit-line oxides 113. The charge capture layer 112 has an ONO (oxide nitride oxide) configuration that is comprised of a nitride film 114 serving as a charge accumulation film and oxide films 115. This configuration achieves a memory cell transistor that can store therein hot electrons in the charge capture layer 112. The word lines 111 correspond to gates of memory cell transistors, and the buried diffusion layers 110 correspond to a source and a drain of memory cell transistors.

Of the two buried diffusion layers 110 corresponding to a given memory cell transistor, one receives a high potential (e.g., 5 V) to serve as a drain, and the other is coupled to a reference potential (e.g., the ground potential VSS) to serve as a source. When the word line 111 belonging to this memory cell transistor receives a high potential (e.g., 9 V), hot electrons are generated in the vicinity of the buried diffusion layer 110 situated on the drain side (i.e., the side to which the high potential is applied). As a result, electric charge e is injected into the charge accumulation film 114. The position at which the electric charge e is stored inside the charge accumulation film 114 is relatively close to the buried diffusion layer 110 that is receiving the high potential and serving as a drain.

Thereafter, the side that served as a drain is coupled to the reference potential as a source, and the side that served as a source is coupled to a high potential as a drain, which achieves the injection of electric charge e into the opposite side of the charge accumulation film 114. In this manner, electric charge e can be injected to both ends of the charge accumulation film 112, thereby achieving the storage of 2-bit data in a single memory cell transistor. As previously noted, this is made possible by the characteristics of the charge accumulation film 114 that electric charge does not move in the nitride film 114 serving as a charge capture material.

When the information represented by the state of charge injection is to be read, the buried diffusion layer 110 that served as a drain at the time of writing is coupled to a reference potential, and the buried diffusion layer 110 that served as a source at the time of writing receives a read potential (e.g., 1.5 V). Further, the word line 111 has a read gate potential (e.g., 5 V) applied thereto. In this manner, a read operation is carried out.

In the related-art configuration, a leak current runs from the buried diffusion layer 110 serving as a drain coupled to the read potential to the adjacent memory cell transistor that is not subjected to the read operation. In the present invention, however, the buried diffusion layer 110 (sub-bit line) into which the leak current would flow is set to the HIGH potential as previously described, thereby preventing the generation of a leak current.

The present invention is applicable to various types of nonvolatile semiconductor memory devices such as EEPROM, flash memories, MNOS, etc., as long as a virtual-ground memory array is employed therein.

Further, the present invention is not limited to these embodiments, but various variations and modifications may be made without departing from the scope of the present invention.

The present application is based on Japanese priority application No. 2001-209639 filed on Jul. 10, 2001, with the Japanese Patent Office, the entire contents of which are hereby incorporated by reference.

What is claimed is:

1. A nonvolatile semiconductor memory device, comprising:
a virtual-ground memory array which includes a plurality of nonvolatile memory cells and sub-bit lines connected to the nonvolatile memory cells;
first and second selection lines;
first and second selection transistors which become conductive in response to activation of the first selection line;
a third selection transistor which become conductive in response to activation of the second selection line;
a first main bit line which is coupled to and supplies a drain potential to a sub-bit line situated on a drain side of a selected memory cell through the first selection transistor;
a second main bit line which is coupled to and supplies a source potential to a sub-bit line situated on a source side of the selected memory cell through one of the second selection transistor and the third selection transistor; and
a third main bit line which is coupled to a sub-bit line adjacent to said sub-bit line situated on the drain side of the selected memory cell through another one of the second selection transistor and the third selection transistor, and is coupled to a potential substantially the same as the drain potential.

2. The nonvolatile semiconductor memory device as claimed in claim 1, further comprising first through third potential selection units connected to the first through third main bit lines, respectively, wherein each of said first through third potential selection units selects one of the drain potential, the source potential, and the potential substantially the same as the drain potential.

3. The nonvolatile semiconductor memory device as claimed in claim 1, further comprising circuits which are separate from each other and generate the drain potential, the source potential, and the potential substantially the same as the drain potential, respectively.

4. The nonvolatile semiconductor memory device as claimed in claim 1, wherein each of said nonvolatile memory cells stores therein 2 bits of information.

5. A nonvolatile semiconductor memory device, comprising:
a virtual-ground memory array which includes a plurality of nonvolatile memory cells and sub-bit lines connected to the nonvolatile memory cells;
first through third selection lines;
first and second selection transistors which become conductive in response to activation of the first selection line;
a third selection transistor which become conductive in response to activation of the second selection line;
a fourth selection transistor which become conductive in response to activation of the third selection line;
a first main bit line which is coupled through the first selection transistor to a first sub-bit line;
a second main bit line which is coupled through the second selection transistor to a second sub-bit line that is adjacent to the first sub-bit line on one side thereof; and
a third main bit line which is coupled through the third selection transistor to a third sub-bit line that is adjacent to the first sub-bit line on another side thereof, and is coupled through the fourth selection transistor to a fourth sub-bit line that is adjacent to the second sub-bit line.

6. The nonvolatile semiconductor memory device as claimed in claim 5, further comprising first through third potential selection units connected to the first through third main bit lines, respectively, wherein each of said first through third potential selection units selects one of a drain potential, a source potential, and a potential substantially the same as the drain potential, and wherein the potential substantially the same as the drain potential is applied to a sub-bit line that is adjacent to a drain on one side thereof opposite a source.

7. The nonvolatile semiconductor memory device as claimed in claim 6, further comprising circuits which are separate from each other and generate the drain potential, the source potential, and the potential substantially the same as the drain potential, respectively.

8. A nonvolatile semiconductor memory device, comprising:
a virtual-ground memory array which includes a plurality of nonvolatile memory cells and sub-bit lines connected to the nonvolatile memory cells;
two selection transistors which are connected to two respective sub-bit lines adjacent to each other, and become conductive in response to a common selection signal;
a first main bit line which is coupled to one of the two sub-bit lines through one of the two selection transistors; and
a second main bit line which is coupled to another one of the two sub-bit lines through another one of the two selection transistors, wherein a potential substantially the same as a drain potential is applied to a sub-bit line that is adjacent to a drain on one side thereof opposite a source.

9. A nonvolatile semiconductor memory device, comprising:

a virtual-ground memory array which includes a plurality of nonvolatile memory cells and sub-bit lines connected to the nonvolatile memory cells;

a plurality of main bit lines;

a plurality of selection transistors connecting between the respective sub-bit lines and the respective main bit lines; and a plurality of selection lines which are connected to gates of the selection transistors, and are activated to make the selection transistors conductive, wherein only two of the selection lines are simultaneously activated to supply a drain potential to a sub-bit line serving as a drain, to supply a source potential to a sub-bit line serving as a source, and to supply a potential substantially the same as the drain potential to a sub-bit line that is adjacent to the drain on one side thereof opposite the source.

10. The nonvolatile semiconductor memory device as claimed in claim 9, further comprising potential selection units connected to the respective main bit lines, wherein each of the potential selection units selects one of the drain potential, the source potential, and the potential substantially the same as the drain potential.

* * * * *